(12) United States Patent
Bhagavatula et al.

(10) Patent No.: US 10,044,321 B2
(45) Date of Patent: Aug. 7, 2018

(54) SYSTEM AND METHOD FOR LINEARIZING A TRANSMITTER BY REJECTING HARMONICS AT MIXER OUTPUT

(71) Applicant: Samsung Electronics Co., Ltd., Gyeonggi-do (KR)

(72) Inventors: Venumadhav Bhagavatula, Santa Clara, CA (US); Siuchuang Ivan Lu, San Jose, CA (US); Sang Won Son, Palo Alto, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/277,534

(22) Filed: Sep. 27, 2016

(65) Prior Publication Data

US 2018/0041168 A1 Feb. 8, 2018

Related U.S. Application Data

(60) Provisional application No. 62/370,028, filed on Aug. 2, 2016.

(51) Int. Cl.
H03D 7/14 (2006.01)

(52) U.S. Cl.
CPC ......... *H03D 7/1466* (2013.01); *H03D 7/1441* (2013.01)

(58) Field of Classification Search
CPC .................... H03D 7/1466; H03D 7/1441
See application file for complete search history.

(56) References Cited

U.S. PATENT DOCUMENTS 5,694,093 A * 12/1997 DaSilva .................. H03C 1/52
   332/103
6,144,845 A * 11/2000 Durec .................. H03D 7/163
   455/285

(Continued)

OTHER PUBLICATIONS

Mirzaei, Ahmad et al., Analysis of direct-conversion IQ transmitters with 25% duty-cycle passive mixers IEEE Transactions on Circuits and Systems I Regular Papers (vol. 58, Issue: 10) pp. 2318-2331 ISSN:1549-8328 INSPEC Accession No. 12267683 DOI:10.1109/TCSI.202011.2142790 Date of Publication: May 19, 2011 Date of Current Version : Sep. 26, 2011 Issue Date: Oct. 2011 Sponsored by : IEEE Circuits and Systems Society Publisher: IEEE May 19, 2011.

(Continued)

*Primary Examiner* — Thomas J Hiltunen
(74) *Attorney, Agent, or Firm* — The Farrell Law Firm, P.C.

(57) ABSTRACT

An apparatus and a method. The apparatus includes passive mixers, wherein each of the passive mixers includes a first input for receiving $BB_I$, a second input for receiving $\overline{BB_I}$, a third input for receiving $BB_Q$, a fourth input for receiving $\overline{BB_Q}$, a fifth input for receiving a first clock signal with a unique phase shift within one of the passive mixers, a sixth input for receiving a second clock signal with a unique phase shift within one of the passive mixers, a seventh input for receiving a third clock signal with a unique phase shift within one of the passive mixers, an eighth input for receiving a fourth clock signal with a unique phase shift within one of the passive mixers, and at least one output; and a voltage-domain vector summation array connected to the output of each of the passive mixers.

14 Claims, 8 Drawing Sheets

(56) References Cited

U.S. PATENT DOCUMENTS

| | | | | |
|---|---|---|---|---|
| 7,113,760 | B1* | 9/2006 | Petrov | H03D 1/2245 455/209 |
| 7,457,605 | B2* | 11/2008 | Thompson | H03D 7/1441 455/285 |
| 7,509,110 | B2 | 3/2009 | Hayashi et al. | |
| 7,784,015 | B2* | 8/2010 | Pitts | G06F 17/5072 430/5 |
| 7,986,192 | B2 | 7/2011 | Lee et al. | |
| 8,138,817 | B2 | 3/2012 | Brekelmans et al. | |
| 8,260,223 | B2* | 9/2012 | He | H03D 7/1441 455/120 |
| 8,299,865 | B2* | 10/2012 | Nakamura | H04L 27/36 332/103 |
| 8,385,475 | B2 | 2/2013 | He et al. | |
| 8,606,210 | B2* | 12/2013 | Ru | H03D 7/14 455/280 |
| 8,660,508 | B2 | 2/2014 | Jeurissen et al. | |
| 8,797,111 | B2* | 8/2014 | Oishi | H03H 7/21 327/552 |
| 8,920,326 | B2 | 12/2014 | Nimran P A et al. | |
| 9,020,458 | B2* | 4/2015 | Goldblatt | H04L 25/03878 455/209 |
| 9,071,197 | B2* | 6/2015 | Vora | H03D 7/166 |
| 9,118,276 | B2* | 8/2015 | Goel | H03B 1/04 |
| 9,197,257 | B2 | 11/2015 | Axholt | |
| 9,218,513 | B2 | 12/2015 | Winiecki et al. | |
| 2012/0049926 | A1 | 3/2012 | Shimizu et al. | |
| 2015/0094004 | A1 | 4/2015 | Vora et al. | |
| 2016/0112146 | A1 | 4/2016 | Lau et al. | |
| 2016/0291056 | A1* | 10/2016 | Pickerd | G01R 13/225 |

OTHER PUBLICATIONS

Subhan, Saqib et al., A 100-800mhz 8-path polyphase transmitter with mixer duty-cycle control achieving <-40dbc for all harmonics Published in: IEEE Journal of Solid-State Circuits (vol. 49, Issue: 3) pp. 595-607 ISSN: 0018-9200 INSPEC Accession No. 14144422 DOI:10.1109/JSSC.2013.2297410 Date of Publication: Jan. 17, 2014 Date of Current Version: Mar. 5, 2014 Issue Date: Mar. 2014 Sponsored by: IEEE Solid-State Circuits Society Publisher: IEEE Jan. 17, 2014.

Rafi, A. A. et al., Harmonic rejection mixing techniques using clock-gating IEEE J. of Solid-State Circuits, vol. 48, No. 8, pp. 1862-1874, [2013].

Chen, Y.-H. et al An LTE SAW-less transmitter using 33% dutycycle LO signals for harmonic suppression, IEEE Int. Solid-State Circuits Conf. Dig. Tech. Papers, pp. 172-173, [2015].

Weldon, J. et.al., A 1.75 GHz highly-integrated narrow-band MOS transmitter with harmonic-rejection mixers, IEEE Int. Solid-State Circuits Conf. Dig. Tech. Papers, pp. 160-161, [2001].

* cited by examiner

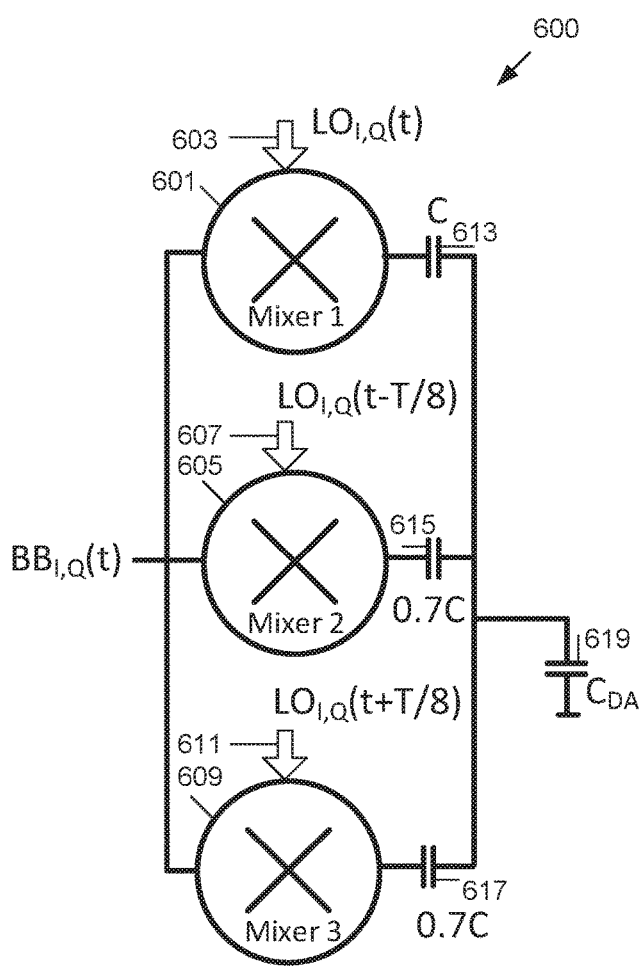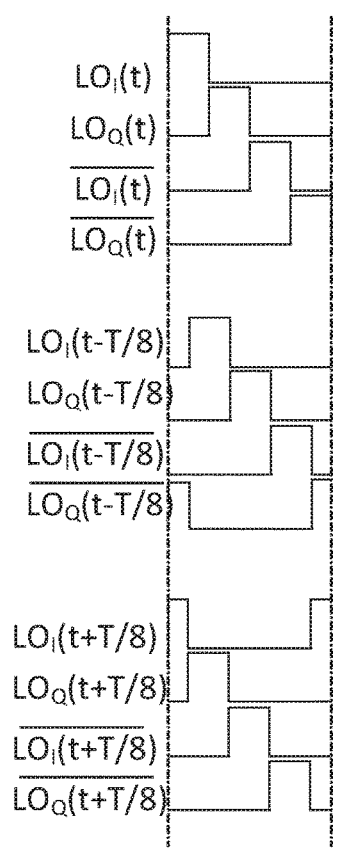
FIG. 6
FIG. 7

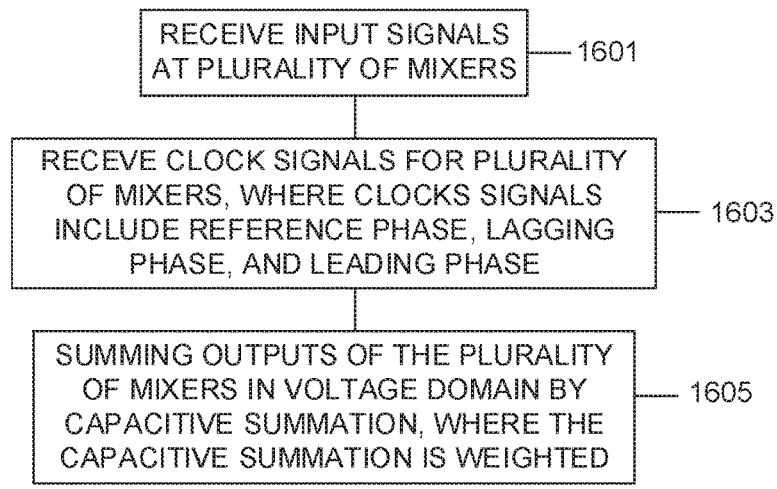
FIG. 16
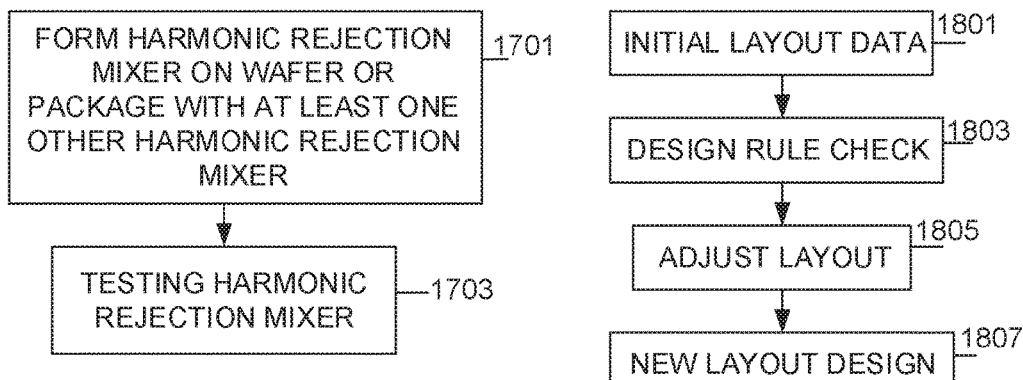
FIG. 17
FIG. 18

SYSTEM AND METHOD FOR LINEARIZING A TRANSMITTER BY REJECTING HARMONICS AT MIXER OUTPUT

PRIORITY

This application claims priority under 35 U.S.C. § 119(e) to a U.S. Provisional Patent Application filed on Aug. 2, 2016 in the United States Patent and Trademark Office and assigned Ser. No. 62/370,028, the entire contents of which are incorporated herein by reference.

FIELD

The present disclosure relates generally to an apparatus and a method for linearizing a transmitter, and more particularly, to an apparatus and method for linearizing a transmitter by rejecting harmonics at an output of a mixer.

BACKGROUND

A cellular transmitter must typically satisfy stringent spectral emission and noise standards or specifications while consuming a low amount of power to extend battery life. In addition, for long term evolution (LTE), a transmitter must support single resource block (RB) and multiple RB cases. To meet spectral emission mask (SEM) specifications, the linearity of a cellular transmitter is significant. Counter intermodulation (CIM) products are one of the dominant contributors to non-linearity. One of the fundamental (and undesirable) properties of a voltage or current-commutating mixer is that the mixer generates a strong third-harmonic component. As a result, for a clock frequency $F_{LO}$ of a local oscillator, and a baseband frequency $F_{BB}$, a mixer output contains a desired signal at $F_{LO}+F_{BB}$ and an undesired signal at $3F_{LO}-F_{BB}$. A signal centered around $3F_{LO}$ may only be 10 dB lower than a signal centered around $F_{LO}$.

SUMMARY

According to one embodiment, an apparatus includes a plurality of passive mixers, wherein each of the plurality of passive mixers includes a first input for receiving a baseband in-phase signal $BB_I$, a second input for receiving an inverse of the baseband in-phase signal $\overline{BB_I}$, a third input for receiving a baseband quadrature signal $BB_Q$, a fourth input for receiving an inverse of the baseband quadrature signal $\overline{BB_Q}$, a fifth input for receiving a first clock signal with a unique phase shift within one of the plurality of passive mixers, a sixth input for receiving a second clock signal with a unique phase shift within one of the plurality of passive mixers, a seventh input for receiving a third clock signal with a unique phase shift within one of the plurality of passive mixers, an eighth input for receiving a fourth clock signal with a unique phase shift within one of the plurality of passive mixers, and at least one output; and a voltage-domain vector summation array connected to the output of each of the plurality of passive mixers.

According to one embodiment, a method includes mixing, by a plurality of passive mixers, a baseband in-phase signal $BB_I$, an inverse of the baseband in-phase signal $\overline{BB_I}$, a baseband quadrature signal $BB_Q$, and an inverse of the baseband quadrature signal $\overline{BB_Q}$, wherein each of the plurality of passive mixers includes a first input for receiving $BB_I$, a second input for receiving $\overline{BB_I}$, a third input for receiving $BB_Q$, a fourth input for receiving $\overline{BB_Q}$, a fifth input for receiving a first clock signal with a unique phase shift within one of the plurality of passive mixers, a sixth input for receiving a second clock signal with a unique phase shift within one of the plurality of passive mixers, a seventh input for receiving a third clock signal with a unique phase shift within one of the plurality of passive mixers, an eighth input for receiving a fourth clock signal with a unique phase shift within one of the plurality of passive mixers, and at least one output; and summing the outputs of the plurality of passive mixers by a voltage-domain vector summation array connected to the output of each of the plurality of passive mixers.

According to one embodiment, a method of manufacturing a harmonic rejection mixer includes forming the harmonic rejection mixer as part of a wafer or package that includes at least one other harmonic rejection mixer, wherein the harmonic rejection mixer is configured to mix, by a plurality of passive mixers, a baseband in-phase signal $BB_I$, an inverse of the baseband in-phase signal $\overline{BB_I}$, a baseband quadrature signal $BB_Q$, and an inverse of the baseband quadrature signal $\overline{BB_Q}$, wherein each of the plurality of passive mixers includes a first input for receiving $BB_I$, a second input for receiving $\overline{BB_I}$, a third input for receiving $BB_Q$, a fourth input for receiving $\overline{BB_Q}$, a fifth input for receiving a first clock signal with a unique phase shift within one of the plurality of passive mixers, a sixth input for receiving a second clock signal with a unique phase shift within one of the plurality of passive mixers, a seventh input for receiving a third clock signal with a unique phase shift within one of the plurality of passive mixers, an eighth input for receiving a fourth clock signal with a unique phase shift within one of the plurality of passive mixers, and at least one output; and sum the outputs of the plurality of passive mixers by a voltage-domain vector summation array connected to the output of each of the plurality of passive mixers; and testing the harmonic rejection mixer, wherein testing the harmonic rejection mixer comprises testing the harmonic rejection mixer and the at least one other harmonic rejection mixer using one or more electrical to optical converters, one or more optical splitters that split an optical signal into two or more optical signals, and one or more optical to electrical converters.

According to one embodiment, a method of constructing an integrated circuit includes generating a mask layout for a set of features for a layer of the integrated circuit, wherein the mask layout includes standard cell library macros for one or more circuit features that include a harmonic rejection mixer configured to mix, by a plurality of passive mixers, a baseband in-phase signal $BB_I$, an inverse of the baseband in-phase signal $\overline{BB_I}$, a baseband quadrature signal $BB_Q$, and an inverse of the baseband quadrature signal $\overline{BB_Q}$, wherein each of the plurality of passive mixers includes a first input for receiving $BB_I$, a second input for receiving $\overline{BB_I}$, a third input for receiving $BB_Q$, a fourth input for receiving $\overline{BB_Q}$, a fifth input for receiving a first clock signal with a unique phase shift within one of the plurality of passive mixers, a sixth input for receiving a second clock signal with a unique phase shift within one of the plurality of passive mixers, a seventh input for receiving a third clock signal with a unique phase shift within one of the plurality of passive mixers, an eighth input for receiving a fourth clock signal with a unique phase shift within one of the plurality of passive mixers, and at least one output; and sum the mixed $BB_I$, $\overline{BB_I}$, $BB_Q$, and $\overline{BB_Q}$ by a voltage-domain vector summation array connected to the output of each of the plurality of passive mixers; disregarding relative positions of the macros for compliance to layout design rules during the generation of the mask layout; checking the relative positions of the macros for compliance to layout design rules after generating the mask layout; upon detection of noncompliance with the layout design rules by any of the macros, modifying the mask layout by modifying each of the noncompliant macros to comply with the layout design rules; generating a mask according to the modified mask layout with the set of features for the layer of the integrated circuit; and manufacturing the integrated circuit layer according to the mask.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 6 is a schematic diagram of a harmonic rejection mixer and an equivalent input capacitance of a device to which the harmonic rejection mixer may be connected, according to an embodiment of the present disclosure;

FIG. 7 is an illustration of local oscillator waveforms for the harmonic rejection mixer of FIG. 6, according to an embodiment of the present disclosure;

FIG. 16 is a flowchart of a method of a harmonic rejection mixer, according to an embodiment of the present disclosure;

FIG. 17 is a flowchart of a method of manufacturing a harmonic rejection mixer, according to an embodiment of the present disclosure; and FIG. 18 is a flowchart of constructing an integrated circuit, according to an embodiment of the present disclosure.

DETAILED DESCRIPTION OF EMBODIMENTS OF THE PRESENT DISCLOSURE

Figure 1:
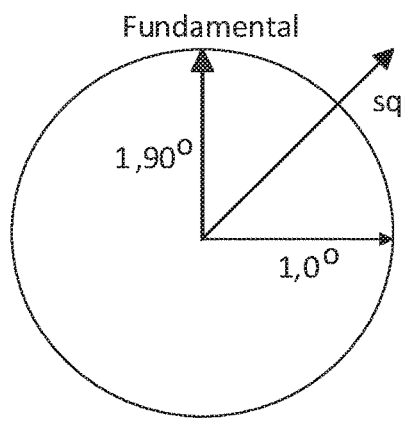
FIG. 1 is an illustration of three signals at one frequency with phase shifts of 0 degrees, 45 degrees, and 90 degrees, respectively.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

The present disclosure is related to electronic systems used for multi-standard and multi-mode wireless communication. A system and method according to embodiments of the present disclosure apply multiple phases of a clock signal (e.g., a local oscillator (LO)) to a passive mixer to reject dominant higher-order harmonics, such as a third harmonic (e.g., a signal that has a frequency that is 3 times that of a fundamental frequency of the clock signal (e.g., $3F_{LO}$)), and a fifth harmonic (e.g., a signal that has a frequency that is 5 times that of a fundamental frequency of the clock signal (e.g., $5F_{LO}$)). The present disclosure provides a linearity enhancement for a passive-mixer-based up-converter (e.g., a transmitter circuit), and may allow a $3F_{LO}$ signal component to be suppressed by greater than 40 dB.

A passive mixer is more linear than an active mixer, because a passive mixer does not employ a non-linear trans-conductance (voltage-to-current) stage. The higher linearity of a passive mixer as compared to an active mixer makes a passive mixer more desirable than an active mixer for high linearity transmitter design. Furthermore, a passive mixer does not consume any direct current (DC) current. A passive mixer employs voltage commutation. Therefore, different phases of a signal path may be summed in an embodiment of the present disclosure using weighted-capacitance-based summation in the voltage domain for the radio frequency (RF) domain. Voltage-domain vector summation may be implemented using capacitors, which ensures that no additional noise is introduced.

A hard-switching mixer is a linear frequency translating circuit. Therefore, at the output of the mixer, a desired signal (e.g., a sum of the frequencies of a local oscillator signal and a baseband signal ($F_{LO}+F_{BB}$)) is accompanied by signal images at harmonics of $F_{LO}$. If a 25% or 50% duty-cycle clock signal drives a mixer, the suppression of the third harmonic ($3F_{LO}$) is only 10 dB. The third-order non-linearity of a drive amplifier (DA) inter-modulates $3F_{LO}-F_{BB}$ and $F_{LO}+F_{BB}$ resulting in spurious emission at $F_{LO}-3F_{BB}$, also referred to as the CIM3 product. A challenging linearity specification is for the LTE B13/1-RB specification, in which the CIM3 product falls within a public-safety band, resulting in an SEM violation. Even at full-RB, the CIM3 product may cause degradation in a transmit error vector magnitude (EVM) for evolved universal terrestrial radio access (E-UTRA) and contribute to receiver desensitization.

In an embodiment of the present disclosure, a harmonic rejection mixer suppresses the third harmonic $3F_{LO}-F_{BB}$ so that a CIM3 product may meet stringent SEM specifications. However, the present disclosure is not limited to harmonic rejection of the third harmonic, but applies to the rejection of any higher-order harmonic, and extends to other bands (e.g., mid-band).

FIG. 1 is an illustration of three signals at ne frequency with phase shifts of 0 degrees, 45 degrees, and 90 degrees, respectively.

Referring to FIG. 1, three signals are illustrated, where each of the three signals has the same fundamental frequency, and where each of the three signals has a relative phase-shift of 0 degrees, 45 degrees, and 90 degrees, respectively. In the time-domain, the three signals may be represented as x(t) for a 0 degree phase shift, x(t+T/8) for a 45 degree phase shift, and x(t+T/4) for a 90 degree phase shift. A vector resulting from the summation of the 0 degree and 90 degree phase-shifted signals, or phasors, is in phase with the 45 degree phasor.

Figure 2:
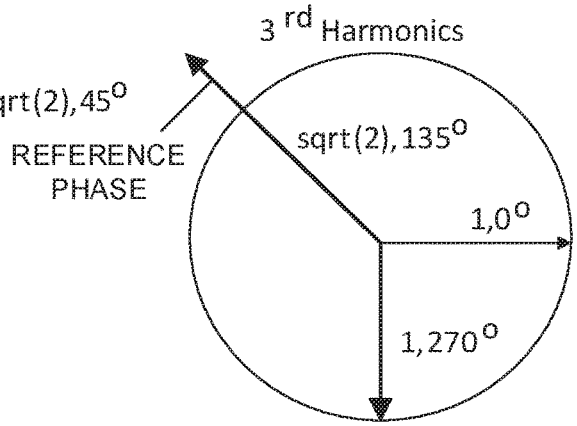
FIG. 2 is an illustration of 3rd harmonic signals of the three signals in FIG. 1.

FIG. 2 is an illustration of 3rd harmonic signals of the three signals in FIG. 1. That is the third harmonic of the 0 degree phase-shifted signal of FIG. 1 is represented as a phasor at 0 degrees in FIG. 2 (e.g., 0 degrees×3=0 degrees). The third harmonic of the 45 degree phase-shifted signal of FIG. 1 is represented as a phasor at 135 degrees in FIG. 2 (e.g., 45 degrees×3=135 degrees). The third harmonic of the 90 degree phase-shifted signal of FIG. 1 is represented as a phasor at 270 degrees in FIG. 2 (e.g., 90 degrees×3=270 degrees).

Referring to FIG. 2, the third-harmonic of the three signals shown in FIG. 1 are represented as phasors. The third harmonic of the x(t) signal, the x(t+T/8) signal, and the x(t+T/4) signal each accumulate a phase of 0 degrees, 135 degrees, and 270 degrees, respectively. A vector summation of a 0 degree vector (or a 360 degree vector) and a 270 degree vector is a 315 degree vector (e.g., (360+270)/2=315), which is perfectly out of phase with a 135 degree vector, and would, effectively, cancel each another.

Figure 3:
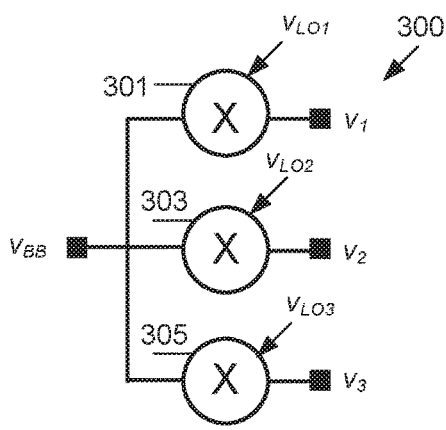
FIG. 3 is a schematic diagram of an apparatus for generating different phase shifts of a signal, according to an embodiment of the present disclosure.

FIG. 3 is a schematic diagram of an apparatus 300 for generating different phase shifts of a signal, according to an embodiment of the present disclosure.

Referring to FIG. 3, the apparatus 300 includes a first mixer 301, a second mixer 303, and a third mixer 305. However, the present disclosure is not limited thereto, and any number of mixers may be used. 360 degrees corresponds to $2\pi$ rad and represents one clock cycle with period T. The signal path $V_{LO2}$ may have a positive (leading or preceding) phase shift $Ø_1$ of T/8 relative to the reference phase of $V_{LO1}$ of T/8, while the signal path $V_{LO3}$ has a negative (lagging or following) phase shift $Ø_2$ of T/8 relative to the reference phase of $V_{LO1}$.

Each of the first mixer 301, the second mixer 303, and the third mixer 305, includes a first input for receiving an input signal, a second input for receiving a local oscillator voltage, and an output. A baseband voltage $V_{BB}$ is applied to the inputs of the first mixer 301, the second mixer 303, and the third mixer 305. A first local oscillator signal path voltage $V_{LO1}=V_{LO}$ is applied to the second input of the first mixer 301. A second local oscillator voltage $V_{LO2}=V_{LO}e^{j\varphi_1}$ is applied to the second input of the second mixer 303. A third local oscillator voltage $V_{LO3}=V_{LO}e^{j\varphi_2}$ is applied to the second input of the third mixer 305. The output of the first mixer 301 provides a voltage $V_1=V_{RF}$ (e.g., an output voltage corresponding to the reference signal). The output of the second mixer 303 provides a voltage $V_2=V_{RF}e^{j\varphi_1}$ (e.g., an output voltage corresponding to the reference signal shifted by T/8 relative to the reference signal). The output of the third mixer 305 provides a voltage $V_3=V_{RF}e^{j\varphi_2}$ (e.g., an output voltage corresponding to the reference signal shifted by −T/8 relative to the reference signal).

Figure 4:
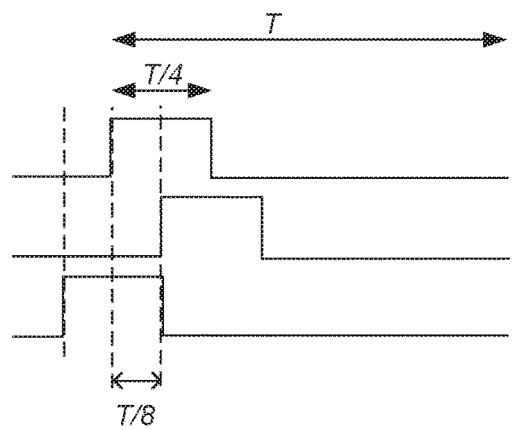
FIG. 4 is a diagram of three phase shifts of a signal, according to an embodiment of the present disclosure.

FIG. 4 is a diagram of three phase shifts of a signal, according to an embodiment of the present disclosure.

Referring to FIG. 4, each signal is shown with a approximately 25% duty cycle, where two of the signals have phase shifts relative to a reference, or baseband, signal of T/8 and −T/8.

Figure 5:
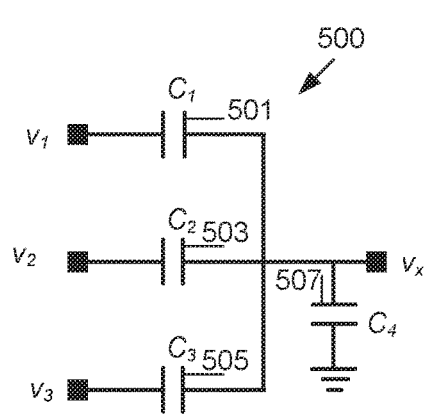
FIG. 5 is a schematic diagram of an apparatus for voltage-domain vector summation that provides amplitude weighting and an equivalent input capacitance of a device to which the apparatus may be connected, according to an embodiment of the present disclosure.

FIG. 5 is a schematic diagram of an apparatus 500 for voltage-domain vector summation that provides amplitude weighting and an equivalent input capacitance of a device to which the apparatus may be connected, according to an embodiment of the present disclosure.

Referring to FIG. 5, the apparatus 500 includes a first capacitor $C_1$ 501, a second capacitor $C_2$ 503, and a third capacitor $C_3$ 505. However, the present disclosure is not limited thereto, and any number of capacitors may be used. A fourth capacitor $C_4$ 507 represents an equivalent input capacitance of a device to which the apparatus 500 may be connected (e.g., a DA).

The first capacitor $C_1$ 501, includes a first terminal for receiving a first, or reference, voltage (e.g., $v_1=V_{RF}$), and a second terminal. The second capacitor $C_2$ 503 includes a first terminal for receiving a second voltage (e.g., $v_2=V_{RF}e^{j\varphi_1}$), and a second terminal. The third capacitor $C_3$ 505 includes a first terminal for receiving a third voltage (e.g., $v_3 = V_{RF} e^{j\varphi_2}$), and a second terminal. The fourth capacitor $C_4$ 507 includes an effective first terminal connected to the second terminals of the first capacitor $C_1$ 501, the second capacitor $C_2$ 503, and the third capacitor $C_3$ 505, and an effective second terminal connected to ground. A voltage $V_x$ (e.g., $V_x = v_1 + v_2 + v_3$.) is provided at the effective first terminal of the fourth capacitor $C_4$.

According to one embodiment of the present disclosure, the apparatus 500 may provide amplitude weighting. Using the principle of superposition, the constituent voltages $v_{x1}$, $v_{x2}$, and $v_{x3}$ which sum to form $V_x$, and represent voltages at the second terminals of the first capacitor $C_1$ 501, the second capacitor $C_2$ 503, and the third capacitor $C_3$ 505, respectively, may be determined as in Equations (1), (2), and (3) as follows:

$$v_{x1} = \frac{C_1}{C_1 + [C_3 + C_2 + C_{DA}]} v_1 = \frac{C_1}{\sum_{i=1 \to 4} C_i} v_1 \quad (1)$$

$$v_{x2} = \frac{C_2}{C_2 + [C_3 + C_1 + C_{DA}]} v_2 = \frac{C_2}{\sum_{i=1 \to 4} C_i} v_2 \quad (2)$$

$$v_{x3} = \frac{C_3}{C_3 + [C_1 + C_2 + C_{DA}]} v_3 = \frac{C_3}{\sum_{i=1 \to 4} C_i} v_3 \quad (3)$$

where $\frac{|v_{x1}|}{|v_{x2}|} = \frac{C_1}{C_2}$ and $\frac{|v_{x1}|}{|v_{x3}|} = \frac{C_1}{C_3}$.

Amplitude weighting is independent of the fourth capacitor $C_4$ 507, where the fourth capacitor $C_4$ 507 is primarily an equivalent input capacitance of a device (e.g., a DA) that receives the voltage $V_x$. Therefore, harmonic rejection is independent of DA gain. Amplitude weighting is a function of the first capacitor $C_1$ 501, the second capacitor $C_2$ 503, and the third capacitor $C_3$ 505. According to one embodiment of the present disclosure, capacitors with linear capacitance may be used (e.g., a metal fringe capacitor).

FIG. 6 is a schematic diagram of a harmonic rejection mixer 600 and an equivalent input capacitance of a device to which the harmonic rejection mixer may be connected, according to an embodiment of the present disclosure. The harmonic rejection mixer 600 may be a multi-phase passive mixer with harmonic-rejection, and may include three passive mixers driven by a common baseband input $BB_{I,Q}(t)$.

Referring to FIG. 6, the harmonic rejection mixer 600 includes a first mixer 601, a second mixer 605, a third mixer 609, a first capacitor 613, a second capacitor 615, and a third capacitor 617. However, the present disclosure is not limited thereto, and any number of mixers and capacitors may be used. A fourth capacitor $C_{DA}$ 619 represents an equivalent input capacitance of a device to which the harmonic rejection mixer 600 may be connected (e.g., a DA).

Each of the first mixer 601, the second mixer 605, and the third mixer 609, includes a first input for receiving an input signal $BB_{I,Q}(t)$. The first mixer 601 also includes a second input for receiving an LO clock signal $LO_{I,Q}(t)$ 603, and an output. The second mixer 605 also includes a second input for receiving an LO clock signal $LO_{I,Q}(t-T/8)$ 607, and an output. The third mixer 609 also includes a second input for receiving an LO clock signal $LO_{I,Q}(t+T/8)$ 611, and an output. The LO clock signals provided to the first mixer 601, the second mixer 605, and the third mixer 609 may be in a reference phase, a lagging (negative) phase by 45 degrees (e.g., −45 degrees), and a leading (positive) phase by 45 degrees (e.g., +45 degrees), respectively.

The first capacitor 613 includes a first terminal connected to the output of the first mixer 601, and a second terminal. The second capacitor 615 includes a first terminal connected to the output of the second mixer 605, and a second terminal. The third capacitor 617 includes a first terminal connected to the output of the third mixer 609, and a second terminal. The fourth capacitor $C_{DA}$ 619 includes an effective first terminal connected to the second terminals of the first capacitor 613, the second capacitor 615, and the third capacitor 617, and an effective second terminal connected to ground.

According to one embodiment, a vector summation of the outputs of the first mixer 601, the second mixer 605, and the third mixer 609 may be performed in a voltage-domain, based on capacitive summation. A load on the output of the harmonic rejection mixer 600 may be an input impedance of a DA, as modeled by the fourth capacitor $C_{DA}$ 619. In FIG. 2, the reference phase must be amplified by a factor of a $\sqrt{2}$ for exact cancellation. However, passive mixers cannot provide amplification. Therefore, the outputs of the second mixer 605 and the third mixer 609 may be scaled down relative to the first mixer 601 so that the reference phase is a factor of a $\sqrt{2}$ greater than the lagging phase and the leading phase. Each of the outputs of the first mixer 601, the second mixer 605, and the third mixer 609 may be connected to a summation capacitor. According to one embodiment, capacitive weighting factors of C and 0.7 C may be used to achieve about 40 dB of suppression of a third harmonic (e.g., $3F_{LO}$). However, the present disclosure is not limited thereto, and other capacitive weighting factors may be used to achieve other levels of suppression. Summation capacitors may also function as direct current (DC) blocking capacitors between the harmonic rejection mixer 600 and another device (e.g., a DA).

FIG. 7 is an illustration of local oscillator waveforms for the harmonic rejection mixer 600 of FIG. 6, according to an embodiment of the present disclosure.

Referring to FIG. 7, the first mixer 601, the second mixer 605, and the third mixer 609 may be clocked by quadrature clock signals, where each clock waveform may have a substantially 25% duty-cycle. The relative phases of the LO waveforms for the first mixer 601, the second mixer 605, and the third mixer 609 may be as illustrated in FIG. 7.

Figure 8:
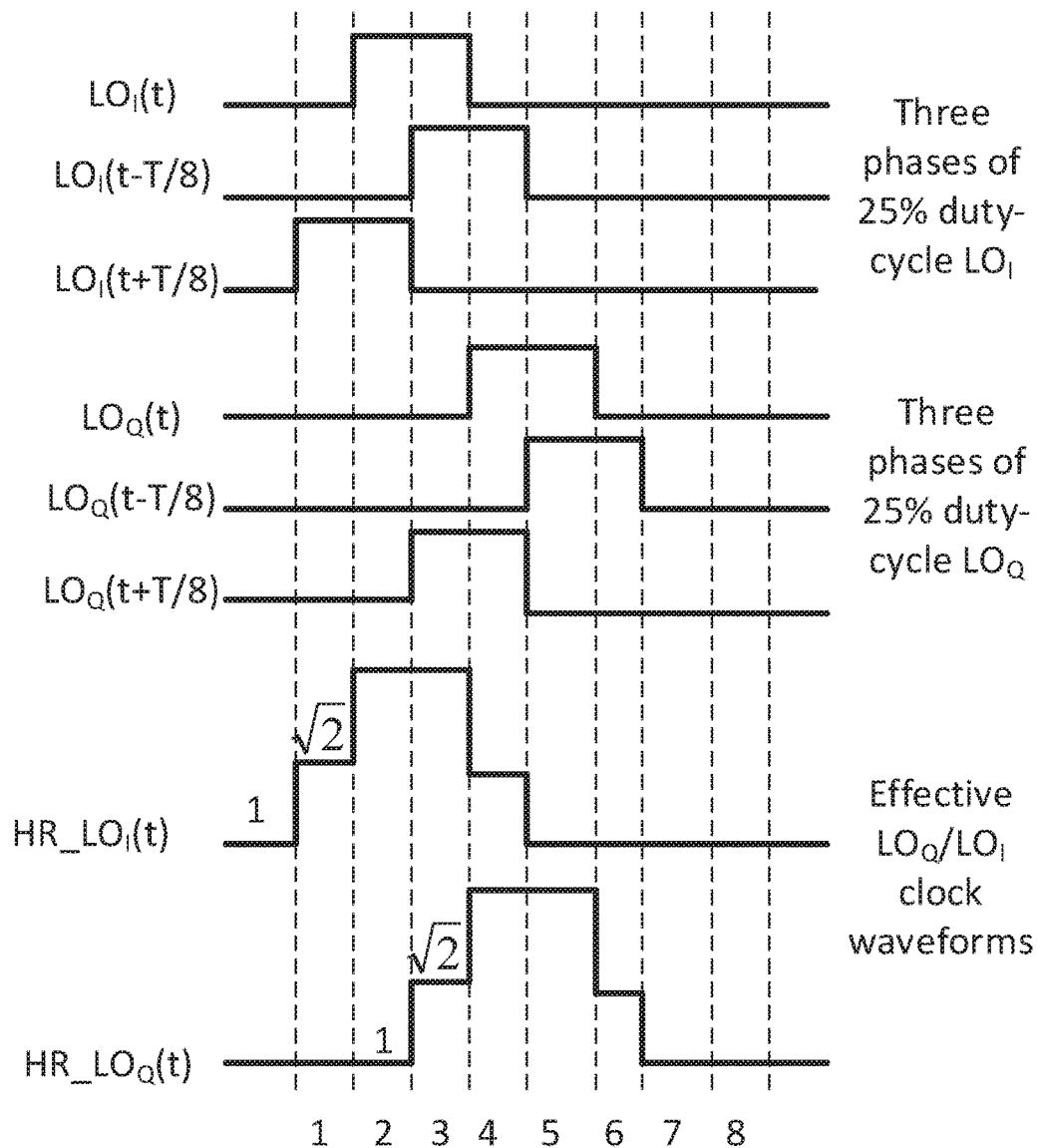
FIG. 8 is a plot of local oscillator signals and synthesized waveforms thereof for the harmonic rejection mixer of FIG. 6, according to an embodiment of the present disclosure.

FIG. 8 is a plot of local oscillator signals and synthesized waveforms thereof for the harmonic rejection mixer of FIG. 6, according to an embodiment of the present disclosure.

Referring to FIG. 8, three in-phase clock signals with 0 degree phase shift $LO_I(t)$, −45 degree phase shift $LO_I(t-T/8)$, and +45 degree phase shift $LO_I(t+T/8)$ are illustrated. In addition, three quadrature clock signals with 0 degree phase shift $LO_Q(t)$, −45 degree phase shift $LO_Q(t-T/8)$, and +45 degree phase shift $LO_Q(t+T/8)$ are illustrated. Furthermore, a synthesized signal of the sums of the three in-phase clock signals $HR\_LO_I(t)$ and a synthesized signal of the sums of the three quadrature clock signals $HR\_LO_Q(t)$ are illustrated.

Figure 9:
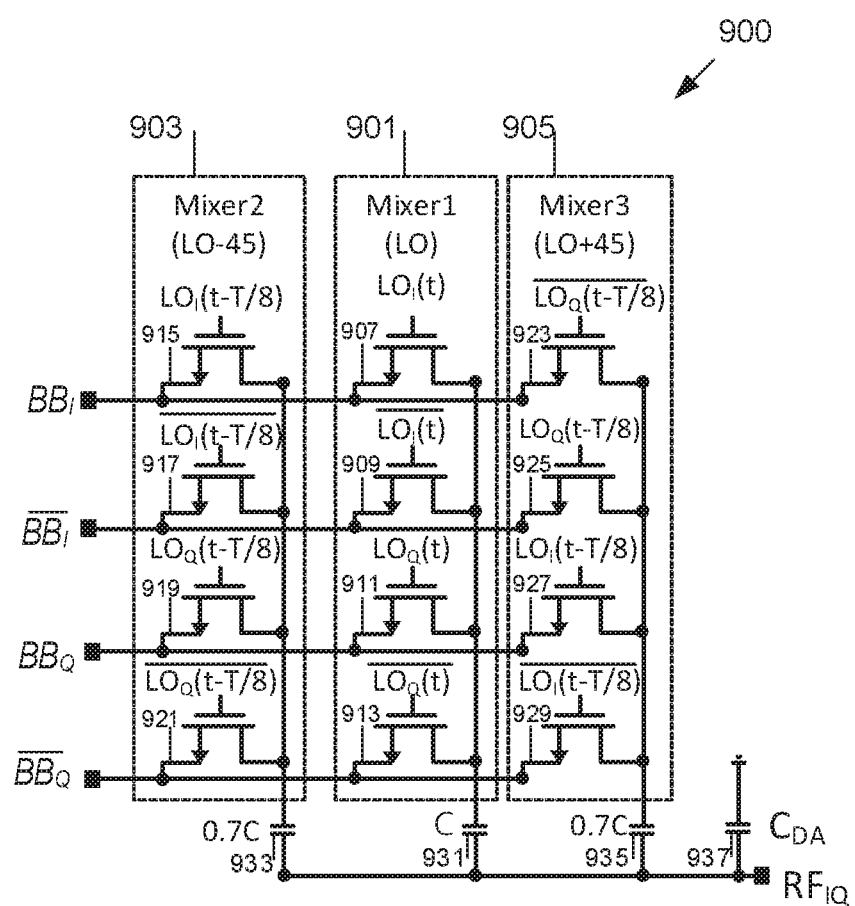
FIG. 9 is a schematic diagram of a single-ended harmonic rejection mixer and an equivalent input capacitance of a device to which the single-ended harmonic rejection mixer may be connected, according to an embodiment of the present disclosure.

FIG. 9 is a schematic diagram of a single-ended harmonic rejection mixer 900 and an equivalent input capacitance of a device to which the single-ended harmonic rejection mixer may be connected, according to an embodiment of the present disclosure.

Referring to FIG. 9, the single-ended harmonic rejection mixer 900 includes a first mixer 901, a second mixer 903, a third mixer 905, a first capacitor 931, a second capacitor 933, and a third capacitor 935. However, the present disclosure is not limited thereto, and any number of mixers and capacitors may be used. A fourth capacitor $C_{DA}$ 937 represents an equivalent input capacitance of a device to which the single-ended harmonic rejection mixer 900 may be connected (e.g., a DA).

Twelve phases are required for the harmonic rejection mixer 900. However, four of the twelve phases are equivalent to four of the twelve phases as indicated in Equations (4)-(7) as follows:

$$LO_I(t+T/8) = \overline{LO_Q(t-T/8)}, \quad (4)$$

$$LO_Q(t+T/8) = LO_I(t-T/8), \quad (5)$$

$$\overline{LO_I(t+T/8)} = LO_Q(t-T/8), \text{ and} \quad (6)$$

$$\overline{LO_Q(t+T/8)} = \overline{LO_I(t-T/8)} \quad (7).$$

The in-phase clock signal $LO_I(t+T/8)$ with a +45 degree phase shift may substitute for an inverse of quadrature clock signal with a −45 degree phase shift $\overline{LO_Q(t-T/8)}$. The quadrature clock signal with a +45 degree phase shift $LO_Q(t+T/8)$ may substitute for an in-phase clock signal with a −45 degree phase shift $LO_I(t-T/8)$. The inverse of the in-phase clock signal with a +45 degree phase shift $\overline{LO_I(t+T/8)}$ may substitute for a quadrature clock signal with a −45 degree phase shift $LO_Q(t-T/8)$. The inverse of the quadrature clock signal with a +45 degree phase shift $\overline{LO_Q(t+T/8)}$ may substitute for an inverse of an in-phase clock signal with a −45 degree phase shift $\overline{LO_I(t-T/8)}$. If each of the substitutions is used, the number of unique phases required by the harmonic rejection mixer may be reduced from twelve to eight, which reduces the area of an integrated circuit (IC) required for LO clock signal routing. A divide-by-4 block 1503 illustrated in FIG. 15 and described below employs each of the substitutions described above to provide eight unique phases to a harmonic rejection mixer 1501.

According to one embodiment, the present disclosure provides a poly-phase passive harmonic rejection up-converter using voltage-domain vector summation. The voltage-domain vector summation may be implemented using the first capacitor 931, the second capacitor 933, and the third capacitor 935, which ensures that no noise is added to the harmonic rejection mixer 900.

The first mixer 901 includes a first transistor 907, a second transistor 909, a third transistor 911, and a fourth transistor 913. The first transistor 907, the second transistor 909, the third transistor 911, and the fourth transistor 913 of the first mixer 901 may each be an n-channel metal oxide semiconductor field effect transistor (NMOSFET). However, the present disclosure is not limited thereto, and any other suitable transistor may be used.

The first transistor 907 of the first mixer 901 includes a source for receiving an input signal (e.g., a baseband in-phase signal $BB_I$), a gate for receiving a clock signal (e.g., a local oscillator in-phase signal without a phase shift $LO_I(t)$), and a drain connected to a first terminal of the first capacitor 931. The second transistor 909 of the first mixer 901 includes a source for receiving an input signal (e.g., an inverse of a baseband in-phase signal $\overline{BB_I}$), a gate for receiving a clock signal (e.g., an inverse of a local oscillator in-phase signal without a phase shift $\overline{LO_I(t)}$), and a drain connected to the first terminal of the first capacitor 931. The third transistor 911 of the first mixer 901 includes a source for receiving an input signal (e.g., a baseband quadrature signal $BB_Q$), a gate for receiving a clock signal (e.g., a local oscillator quadrature signal without a phase shift $LO_Q(t)$), and a drain connected to the first terminal of the first capacitor 931. The fourth transistor 913 of the first mixer 901 includes a source for receiving an input signal (e.g., an inverse of a baseband quadrature signal $\overline{BB_Q}$), a gate for receiving a clock signal (e.g., an inverse of a local oscillator quadrature signal without a phase shift $\overline{LO_Q(t)}$), and a drain connected to the first terminal of the first capacitor 931.

The second mixer 903 includes a first transistor 915, a second transistor 917, a third transistor 919, and a fourth transistor 921. The first transistor 915, the second transistor 917, the third transistor 919, and the fourth transistor 921 of the second mixer 903 may each be an NMOSFET. However, the present disclosure is not limited thereto, and any other suitable transistor may be used.

The first transistor 915 of the second mixer 903 includes a source for receiving an input signal (e.g., the baseband in-phase signal $BB_I$), a gate for receiving a clock signal (e.g., a local oscillator in-phase signal with a phase shift of −45 degrees relative to $LO_I(t)$ (e.g., $LO_I(t-T/8)$)), and a drain connected to a first terminal of the second capacitor 933. The second transistor 917 of the second mixer 903 includes a source for receiving an input signal (e.g., the inverse of the baseband in-phase signal $\overline{BB_I}$), a gate for receiving a clock signal (e.g., an inverse of a local oscillator in-phase signal with a phase shift of −45 degrees relative to $LO_I(t)$ (e.g., $\overline{LO_I(t-T/8)}$)), and a drain connected to the first terminal of the second capacitor 933. The third transistor 919 of the second mixer 903 includes a source for receiving an input signal (e.g., the baseband quadrature signal $BB_Q$), a gate for receiving a clock signal (e.g., a local oscillator quadrature signal with a phase shift of −45 degrees relative to $LO_Q(t)$ (e.g., $LO_Q(t-T/8)$)), and a drain connected to the first terminal of the second capacitor 933. The fourth transistor 921 of the second mixer 903 includes a source for receiving an input signal (e.g., the inverse of a baseband quadrature signal $\overline{BB_Q}$), a gate for receiving a clock signal (e.g., an inverse of a local oscillator quadrature signal with a phase shift of −45 degrees relative to $LO_Q(t)$ (e.g., $\overline{LO_Q(t-T/8)}$)), and a drain connected to the first terminal of the second capacitor 933.

The third mixer 905 includes a first transistor 923, a second transistor 925, a third transistor 927, and a fourth transistor 929. The first transistor 923, the second transistor 925, the third transistor 927, and the fourth transistor 929 of the third mixer 905 may each be an NMOSFET. However, the present disclosure is not limited thereto, and any other suitable transistor may be used.

The first transistor 923 of the third mixer 905 includes a source for receiving an input signal (e.g., the baseband in-phase signal $BB_I$), a gate for receiving a clock signal (e.g., an inverse of the local oscillator quadrature signal with a phase shift of −45 degrees relative to $LO_I(t)$ (e.g., $\overline{LO_Q(t-T/8)}$)), and a drain connected to a first terminal of the third capacitor 935. The second transistor 925 of the third mixer 905 includes a source for receiving an input signal (e.g., the inverse of a baseband in-phase signal $\overline{BB_I}$), a gate for receiving a clock signal (e.g., a local oscillator quadrature signal with a phase shift of −45 degrees relative to $\overline{LO_I(t)}$ (e.g., $LO_Q(t-T/8)$)), and a drain connected to the first terminal of the third capacitor 935. The third transistor 927 of the third mixer 905 includes a source for receiving an input signal (e.g., the baseband quadrature signal $BB_Q$), a gate for receiving a clock signal (e.g., a local oscillator in-phase signal with a phase shift of −45 degrees relative to $LO_Q(t)$ (e.g., $LO_I(t-T/8)$)), and a drain connected to the first terminal of the third capacitor 935. The fourth transistor 929 of the third mixer 905 includes a source for receiving an input signal (e.g., the inverse of a baseband quadrature signal $\overline{BB_Q}$), a gate for receiving a clock signal (e.g., an inverse of a local oscillator in-phase signal with a phase shift of −45 degrees relative to $\overline{LO_Q(t)}$ (e.g., $\overline{LO_I(t-T/8)}$)), and a drain connected to the first terminal of the third capacitor 935.

The second terminals of the first capacitor 931, the second capacitor 933, and the third capacitor 935 are connected to an effective first terminal ($RF_{IQ}$) of the fourth capacitor $C_{DA}$ 937. A second effective terminal of the fourth capacitor $C_{DA}$ 937 is connected to ground.

According to one embodiment, a vector summation of the outputs of the first mixer 901, the second mixer 903, and the third mixer 905 may be performed in a voltage-domain, based on capacitive summation. A load on the output of the harmonic rejection mixer 900 may be an input impedance of a DA, as modeled by the fourth capacitor $C_{DA}$ 937. In FIG. 2, the reference phase must be amplified by a factor of a √2 for exact cancellation. However, passive mixers cannot provide amplification. Therefore, the outputs of the second mixer 903 and the third mixer 605 may be scaled down relative to the first mixer 901 so that the reference phase is a factor of a √2 greater than the lagging phase and the leading phase. Each of the outputs of the first mixer 901, the second mixer 903, and the third mixer 905 may be connected to a summation capacitor. According to one embodiment, capacitive weighting factors of C and 0.7 C may employed to achieve a level of about 40 dB in suppression of a third harmonic (e.g., $3F_{LO}$). However, the present disclosure is not limited thereto, and other capacitive weighting factors may be employed to achieve other suppression levels. Summation capacitors may also function as DC blocking capacitors between the harmonic rejection mixer 900 and a device (e.g., a DA).

Figure 10:
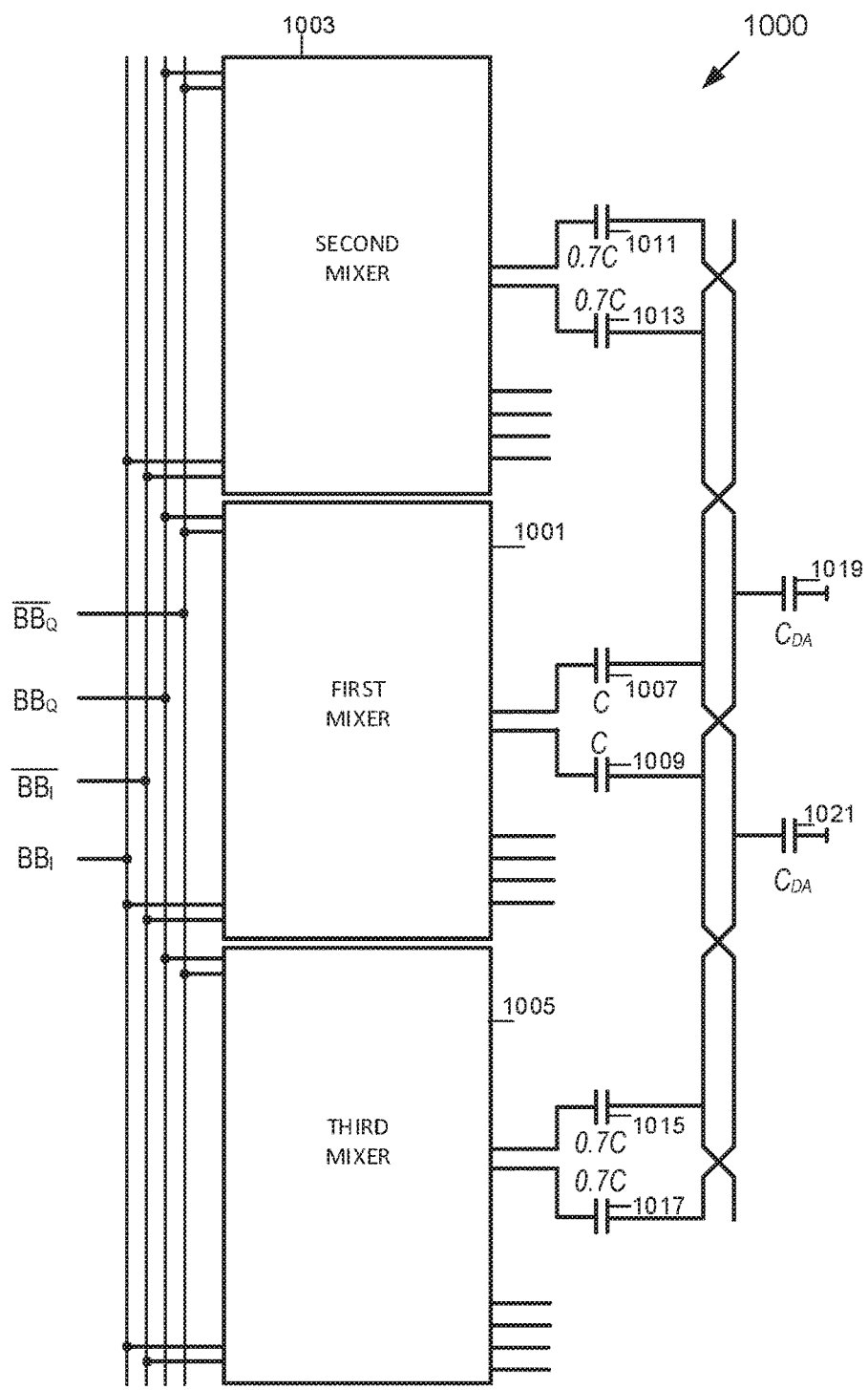
FIG. 10 is a schematic diagram of a differential harmonic rejection mixer and two equivalent input capacitances of a device to which the differential harmonic rejection mixer may be connected, according to an embodiment of the present disclosure.

FIG. 10 is a schematic diagram of a differential harmonic rejection mixer 1000 and two equivalent input capacitances of a device to which the differential harmonic rejection mixer may be connected, according to an embodiment of the present disclosure.

Referring to FIG. 10, the differential harmonic rejection mixer 1000 includes a first mixer 1001, a second mixer 1003, a third mixer 1005, a first capacitor 1007, a second capacitor 1009, a third capacitor 1011, a fourth capacitor 1013, a fifth capacitor 1015, and a sixth capacitor 1017. However, the present disclosure is not limited thereto, and any number of mixers and capacitors may be used. A seventh capacitor 1019 and an eighth capacitor 1021 represents equivalent input capacitances of a device to which the differential harmonic rejection mixer 1000 may be connected (e.g., a DA).

The first mixer 1001 includes a first input for receiving a baseband quadrature signal $BB_Q(t)$, a second input for receiving an inverse of the baseband quadrature signal $\overline{BB_Q(t)}$, a third input for receiving a baseband in-phase signal $BB_I(t)$, a fourth input for receiving an inverse of the baseband in-phase signal $\overline{BB_I(t)}$, a fifth input for receiving an in-phase clock signal $LO_I(t)$, a sixth input for receiving an inverse of the in-phase clock signal $\overline{LO_I(t)}$, a seventh input for receiving a quadrature clock signal $LO_Q(t)$, an eighth input for receiving an inverse of the quadrature clock signal $\overline{LO_Q(t)}$, a first output, and a second output.

The second mixer 1003 includes a first input for receiving the baseband quadrature signal $BB_Q(t)$, a second input for receiving the inverse of the baseband quadrature signal $\overline{BB_Q(t)}$, a third input for receiving the baseband in-phase signal $BB_I(t)$, a fourth input for receiving the inverse of the baseband in-phase signal $\overline{BB_I(t)}$, a fifth input for receiving an in-phase clock signal with a +45 degree phase shift $LO_I(t+T/8)$, a sixth input for receiving an inverse of the in-phase clock signal with the +45 degree phase shift $\overline{LO_I(t+T/8)}$, a seventh input for receiving a quadrature clock signal with a +45 degree phase shift $LO_Q(t+T/8)$, an eighth input for receiving an inverse of the quadrature clock signal with the +45 degree phase shift $\overline{LO_Q(t+T/8)}$, a first output, and a second output.

The third mixer 1005 includes a first input for receiving the baseband quadrature signal $BB_Q(t)$, a second input for receiving the inverse of the baseband quadrature signal $\overline{BB_Q(t)}$, a third input for receiving the baseband in-phase signal $BB_I(t)$, a fourth input for receiving the inverse of the baseband in-phase signal $\overline{BB_I(t)}$, a fifth input for receiving a quadrature clock signal with a +45 degree phase shift $LO_Q(t+T/8)$, a sixth input for receiving an inverse of the quadrature clock signal with the +45 degree phase shift $\overline{LO_Q(t+T/8)}$, a seventh input for receiving an in-phase clock signal with a +45 degree phase shift $LO_I(t+T/8)$, an eighth input for receiving an inverse of the in-phase clock signal with a +45 degree phase shift $\overline{LO_I(t+T/8)}$, a first output, and a second output.

The first capacitor 1007 includes a first terminal connected to the first output of the first mixer 1001, and a second terminal connected to an effective first terminal of the eighth capacitor 1021. The second capacitor 1009 includes a first terminal connected to the second output of the first mixer 1001, and a second terminal connected to an effective first terminal of the seventh capacitor 1019. The third capacitor 1011 includes a first terminal connected to the first output of the second mixer 1003, and a second terminal connected to the effective first terminal of the eighth capacitor 1021. The fourth capacitor 1013 includes a first terminal connected to the second output of the second mixer 1003, and a second terminal connected to the effective first terminal of the seventh capacitor 1019. The fifth capacitor 1015 includes a first terminal connected to the first output of the third mixer 1005, and a second terminal connected to the effective first terminal of the eighth capacitor 1021. The sixth capacitor 1017 includes a first terminal connected to the second output of the third mixer 1005, and a second terminal connected to the effective first terminal of the seventh capacitor 1019. An effective second terminal of each of the seventh capacitor 1019 and the eighth capacitor 1021 is connected to ground.

According to one embodiment, a vector summation of the outputs of the first mixer 1001, the second mixer 1003, and the third mixer 1005 may be performed in a voltage-domain, based on capacitive summation. A load on the output of the harmonic rejection mixer 1000 may be input impedances of differential inputs of a device (e.g., a DA), as modeled by the seventh capacitor 1019 and the eighth capacitor 1021. In FIG. 2, the reference phase must be amplified by a factor of a √2 for exact cancellation. However, passive mixers cannot provide amplification. Therefore, the outputs of the second mixer 1003 and the third mixer 1005 may be scaled down relative to the first mixer 1001 so that the reference phase is a factor of a √2 greater than the lagging phase and the leading phase. Each of the outputs of the first mixer 1001, the second mixer 1003, and the third mixer 1005 may be connected to summation capacitors. According to one embodiment, capacitive weighting factors of C and 0.7 C may be employed to achieve a level of about 40 dB in suppression of a third harmonic (e.g., $3F_{LO}$). However, the present disclosure is not limited thereto, and other capacitive weighting factors may be used to achieve other suppression levels. Summation capacitors may also function as DC blocking capacitors between the harmonic rejection mixer 1000 and a device (e.g., a DA).

Figure 11:
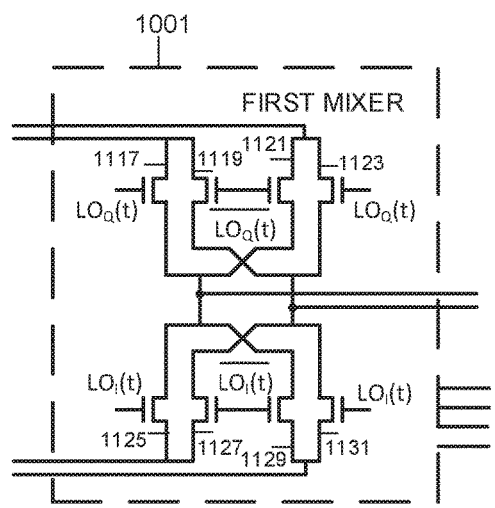
FIGS. 11-13 are schematic diagrams of a first mixer, a second mixer, and a third mixer, respectively, of FIG. 10, according to an embodiment of the present disclosure.

FIG. 11 is a schematic diagram of a first mixer 1001 of FIG. 10, according to an embodiment of the present disclosure.

Referring to FIG. 11, the first mixer 1001 includes a first transistor 1117, a second transistor 1119, a third transistor 1121, a fourth transistor 1123, a fifth transistor 1125, a sixth transistor 1127, a seventh transistor 1129, and an eighth transistor 1131. The first transistor 1117, the second transistor 1119, the third transistor 1121, the fourth transistor 1123, the fifth transistor 1125, the sixth transistor 1127, the seventh transistor 1129, and the eighth transistor 1131 of the first mixer 1001 may each be an NMOSFET. However, the present disclosure is not limited thereto, and any other suitable transistor may be used.

The first transistor 1117 of the first mixer 1001 includes a source connected to the second input of the first mixer 1001 for receiving $\overline{BB_Q}$, a gate connected to the seventh input of the first mixer 1001 for receiving a clock signal (e.g., a quadrature signal without a phase shift $LO_Q(t)$), and a drain connected to the first output of the first mixer 1001. The second transistor 1119 of the first mixer 1001 includes a source connected to the second input of the first mixer 1001 for receiving $\overline{BB_Q}$, a gate connected to the eighth input of the first mixer 1001 for receiving a clock signal (e.g., an inverse of the quadrature signal without a phase shift $\overline{LO_Q(t)}$), and a drain connected to the second output of the first mixer 1001. The third transistor 1121 of the first mixer 1001 includes a source connected to the first input of the first mixer 1001 for receiving $BB_Q$, a gate connected to the eighth input of the first mixer 1001 for receiving a clock signal (e.g., the inverse of the quadrature signal without a phase shift $\overline{LO_Q(t)}$), and a drain connected to the first output of the first mixer 1001. The fourth transistor 1123 of the first mixer 1001 includes a source connected to the first input of the first mixer 1001 for receiving $BB_Q$, a gate connected to the seventh input of the first mixer 1001 for receiving a clock signal (e.g., the quadrature signal without a phase shift $LO_Q(t)$), and a drain connected to the second output of the first mixer 1001. The fifth transistor 1125 of the first mixer 1001 includes a source connected to the third input of the first mixer 1001 for receiving $BB_I$, a gate connected to the fifth input of the first mixer 1001 for receiving a clock signal (e.g., an in-phase signal without a phase shift $LO_I(t)$), and a drain connected to the first output of the first mixer 1001. The sixth transistor 1127 of the first mixer 1001 includes a source connected to the third input of the first mixer 1001 for receiving $BB_I$, a gate connected to the sixth input of the first mixer 1001 for receiving a clock signal (e.g., an inverse of the in-phase signal without a phase shift $\overline{LO_I(t)}$), and a drain connected to the second output of the first mixer 1001. The seventh transistor 1129 of the first mixer 1001 includes a source connected to the fourth input of the first mixer 1001 for receiving $\overline{BB_I}$, a gate connected to the sixth input of the first mixer 1001 for receiving a clock signal (e.g., the inverse of the in-phase signal without a phase shift $\overline{LO_I(t)}$), and a drain connected to the first output of the first mixer 1001. The eighth transistor 1131 of the first mixer 1001 includes a source connected to the fourth input of the first mixer 1001 for receiving $\overline{BB_I}$, a gate connected to the fifth input of the first mixer 1001 for receiving a clock signal (e.g., the in-phase signal without a phase shift $LO_I(t)$), and a drain connected to the second output of the first mixer 1001.

Figure 12:
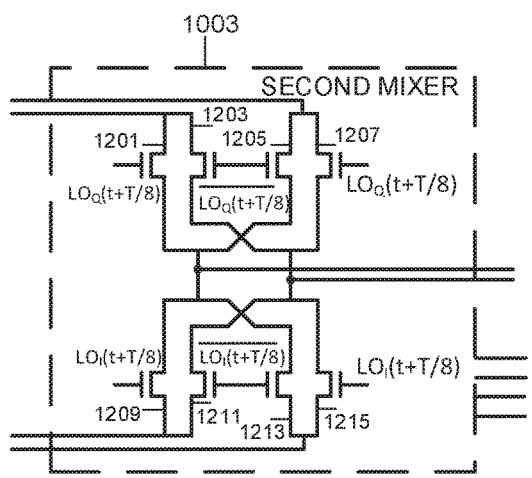

FIG. 12 is a schematic diagram of a second mixer 1003 of FIG. 10, according to an embodiment of the present disclosure.

Referring to FIG. 12, the second mixer 1003 includes a first transistor 1201, a second transistor 1203, a third transistor 1205, a fourth transistor 1207, a fifth transistor 1209, a sixth transistor 1211, a seventh transistor 1213, and an eighth transistor 1215. The first transistor 1201, the second transistor 1203, the third transistor 1205, the fourth transistor 1207, the fifth transistor 1209, the sixth transistor 1211, the seventh transistor 1213, and the eighth transistor 1215 of the second mixer 1003 may each be an NMOSFET. However, the present disclosure is not limited thereto, and any other suitable transistor may be used.

The first transistor 1201 of the second mixer 1003 includes a source connected to the second input of the second mixer 1003 for receiving $\overline{BB_Q}$, a gate connected to the seventh input of the second mixer 1003 for receiving a clock signal (e.g., a quadrature signal with a phase shift of +45 degrees $LO_Q(t+T/8)$), and a drain connected to the first output of the second mixer 1003. The second transistor 1203 of the second mixer 1003 includes a source connected to the second input of the second mixer 1003 for receiving $\overline{BB_Q}$, a gate connected to the eighth input of the second mixer 1003 for receiving a clock signal (e.g., an inverse of the quadrature signal with a phase shift of +45 degrees $\overline{LO_Q(t+T/8)}$), and a drain connected to the second output of the second mixer 1003. The third transistor 1205 of the second mixer 1003 includes a source connected to the first input of the second mixer 1003 for receiving $BB_Q$, a gate connected to the eighth input of the second mixer 1003 for receiving a clock signal (e.g., the inverse of the quadrature signal with a phase shift of +45 degrees $\overline{LO_Q(t)}$), and a drain connected to the first output of the second mixer 1003. The fourth transistor 1207 of the second mixer 1003 includes a source connected to the first input of the second mixer 1003 for receiving $BB_Q$, a gate connected to the seventh input of the second mixer 1003 for receiving a clock signal (e.g., the quadrature signal with a phase shift of +45 degrees $LO_Q(t+T/8)$), and a drain connected to the second output of the second mixer 1003. The fifth transistor 1209 of the second mixer 1003 includes a source connected to the third input of the second mixer 1003 for receiving $BB_I$, a gate connected to the fifth input of the second mixer 1003 for receiving a clock signal (e.g., an in-phase signal with a phase shift of +45 degree $LO_I(t+T/8)$), and a drain connected to the first output of the second mixer 1003. The sixth transistor 1211 of the second mixer 1003 includes a source connected to the third input of the second mixer 1003 for receiving $BB_I$, a gate connected to the sixth input of the second mixer 1003 for receiving a clock signal (e.g., the inverse of the in-phase signal with a phase shift of +45 degrees $\overline{LO_I(t+T/8)}$), and a drain connected to the second output of the second mixer 1003. The seventh transistor 1213 of the second mixer 1003 includes a source connected to the fourth input of the second mixer 1003 for receiving $\overline{BB_I}$, a gate connected to the sixth input of the second mixer 1003 for receiving a clock signal (e.g., the inverse of the in-phase signal with a phase shift of +45 degrees $\overline{LO_I(t+T/8)}$), and a drain connected to the first output of the second mixer 1003. The eighth transistor 1215 of the second mixer 1003 includes a source connected to the fourth input of the second mixer 1003 for receiving $\overline{BB_I}$, a gate connected to the fifth input of the second mixer 1003 for receiving a clock signal (e.g., the in-phase signal with a phase shift of +45 degrees $LO_I(t+T/8)$), and a drain connected to the second output of the second mixer 1003.

Figure 13:
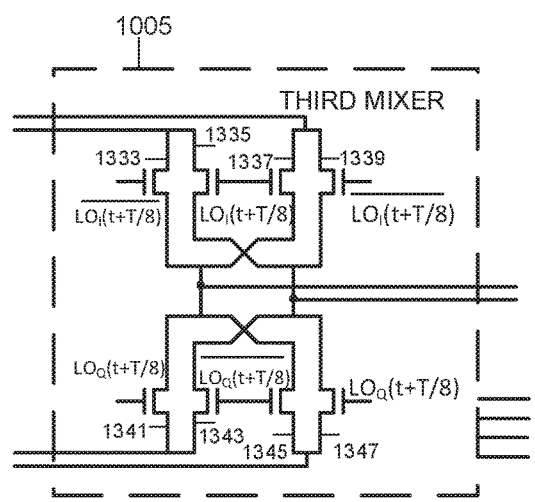

FIG. 13 is a schematic diagram of the third mixer 1005 of FIG. 10, according to an embodiment of the present disclosure.

Referring to FIG. 13, the third mixer 1005 includes a first transistor 1333, a second transistor 1335, a third transistor 1337, a fourth transistor 1339, a fifth transistor 1341, a sixth transistor 1343, a seventh transistor 1345, and an eighth transistor 1347. The first transistor 1333, the second transistor 1335, the third transistor 1337, the fourth transistor 1339, the fifth transistor 1341, the sixth transistor 1343, the seventh transistor 1345, and the eighth transistor 1347 of the third mixer 1005 may each be an NMOSFET. However, the present disclosure is not limited thereto, and any other suitable transistor may be used.

The first transistor 1333 of the third mixer 1005 includes a source connected to the second input of the third mixer 1005 for receiving $\overline{BB_Q}$, a gate connected to the seventh input of the third mixer 1005 for receiving a clock signal (e.g., the inverse of the in-phase signal with a phase shift of +45 degrees $\overline{LO_I(t+T/8)}$), and a drain connected to the first output of the third mixer 1005. The second transistor 1335 of the third mixer 1005 includes a source connected to the second input of the third mixer 1005 for receiving $\overline{BB_Q}$, a gate connected to the eighth input of the third mixer 1005 for receiving a clock signal (e.g., the in-phase signal with a phase shift of +45 degrees $LO_I(t+T/8)$), and a drain connected to the second output of the third mixer 1005. The third transistor 1337 of the third mixer 1005 includes a source connected to the first input of the third mixer 1005 for receiving $BB_Q$, a gate connected to the eighth input of the third mixer 1005 for receiving a clock signal (e.g., the in-phase signal with a phase shift of +45 degrees $LO_I(t+T/8)$), and a drain connected to the first output of the third mixer 1005. The fourth transistor 1339 of the third mixer 1005 includes a source connected to the first input of the third mixer 1005 for receiving $BB_Q$, a gate connected to the seventh input of the third mixer 1005 for receiving a clock signal (e.g., the inverse of the in-phase signal with a phase shift of +45 degrees $\overline{LO_I(t+T/8)}$), and a drain connected to the second output of the third mixer 1005. The fifth transistor 1341 of the third mixer 1005 includes a source connected to the third input of the third mixer 1005 for receiving $BB_I$, a gate connected to the fifth input of the third mixer 1005 for receiving a clock signal (e.g., the quadrature signal with a phase shift of +45 degree $LO_Q(t+T/8)$), and a drain connected to the first output of the third mixer 1005. The sixth transistor 1343 of the third mixer 1005 includes a source connected to the third input of the third mixer 1005 for receiving $BB_I$, a gate connected to the sixth input of the third mixer 1005 for receiving a clock signal (e.g., the inverse of the quadrature signal with a phase shift of +45 degrees $\overline{LO_Q(t+T/8)}$), and a drain connected to the second output of the third mixer 1005. The seventh transistor 1345 of the third mixer 1005 includes a source connected to the fourth input of the third mixer 1005 for receiving $\overline{BB_I}$, a gate connected to the sixth input of the third mixer 1005 for receiving a clock signal (e.g., the inverse of the quadrature signal with a phase shift of +45 degrees $\overline{LO_Q(t+T/8)}$), and a drain connected to the first output of the third mixer 1005. The eighth transistor 1347 of the third mixer 1005 includes a source connected to the fourth input of the third mixer 1005 for receiving $\overline{BB_I}$, a gate connected to the fifth input of the third mixer 1005 for receiving a clock signal (e.g., the quadrature signal with a phase shift of +45 degrees $LO_Q(t+T/8)$), and a drain connected to the second output of the third mixer 1005.

Figure 14:
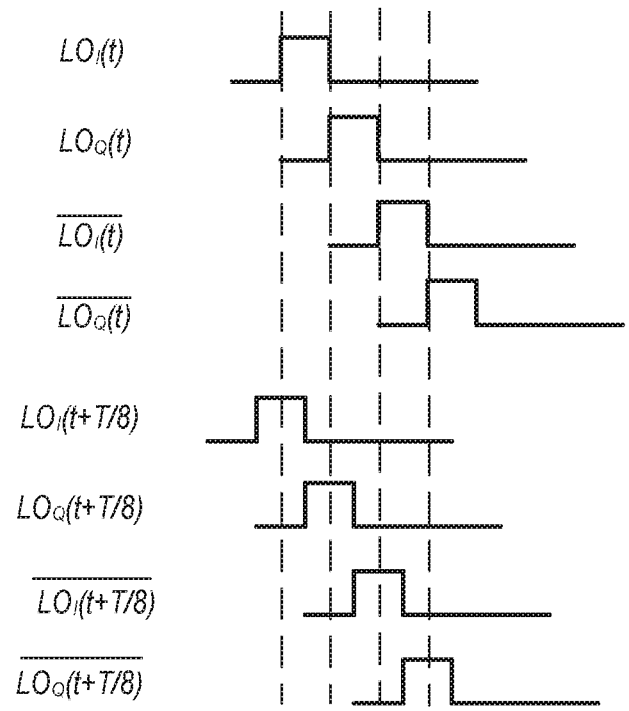
FIG. 14 is a plot of local oscillator signals of the differential harmonic rejection mixer of FIG. 10, according to an embodiment of the present disclosure.

FIG. 14 is a plot of local oscillator signals of the differential harmonic rejection mixer 1000 of FIG. 10, according to an embodiment of the present disclosure.

Referring to FIG. 14, clock signals $LO_I(t)$, $LO_Q(t)$, $\overline{LO_I(t)}$, $\overline{LO_Q(t)}$, $LO_I(t+T/8)$, $LO_Q(t+T/8)$, $\overline{LO_I(t+T/8)}$, and $\overline{LO_Q(t+T/8)}$ are illustrated, each with a substantially 25% duty cycle. Using eight clock signals instead of twelve clock signals reduces the area of an IC required for LO clock signal routing.

Figure 15:
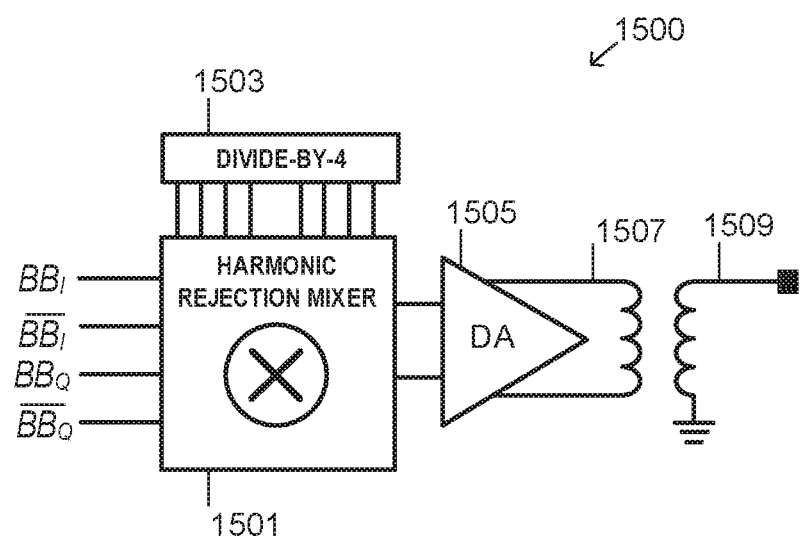
FIG. 15 is a block diagram of a system that includes a harmonic rejection mixer, according to an embodiment of the present disclosure.

FIG. 15 is a block diagram of a system 1500 that includes a harmonic rejection mixer 1501, according to an embodiment of the present disclosure.

Referring to FIG. 15, the system 1500 includes the harmonic rejection mixer 1501, a divide-by-4 device 1503, a DA 1505, a first inductor 1507, and a second inductor 1509.

The harmonic rejection mixer 1501 includes a first set of four inputs for receiving $BB_I$, $\overline{BB_I}$, $BB_Q$, and $\overline{BB_Q}$, a second set of inputs for receiving eight clock signals (e.g., $LO_I(t)$, $LO_Q(t)$, $\overline{LO_I(t)}$, $\overline{LO_Q(t)}$, $LO_I(t+T/8)$, $LO_Q(t+T/8)$, $\overline{LO_I(t+T/8)}$, and $\overline{LO_Q(t+T/8)}$), a first output, and a second output.

The divide-by-4 device 1503 includes eight outputs connected to the second set of inputs of the harmonic rejection mixer 1501, where the eight outputs are clock signals (e.g., $LO_I(t)$, $LO_Q(t)$, $\overline{LO_I(t)}$, $\overline{LO_Q(t)}$, $LO_I(t+T/8)$, $LO_Q(t+T/8)$, $\overline{LO_I(t+T/8)}$, and $\overline{LO_Q(t+T/8)}$).

The DA 1505 includes a first input connected to the first output of the harmonic rejection mixer 1501, a second input connected to the second output of the harmonic rejection mixer 1501, a first output, and a second output.

The first inductor 1507 is connected between the first output and the second output of the DA 1505.

The second inductor 1509 includes a first terminal connected to ground, and a second terminal, which is the output of the system 1500, where the second inductor 1509 is spaced sufficiently close to the first inductor 1507 to establish a mutual inductance there between.

FIG. 16 is a flowchart of a method of operating a harmonic rejection mixer, according to an embodiment of the present disclosure.

Referring to FIG. 16, the harmonic rejection mixer receives input signals $BB_I$, $\overline{BB_I}$, $BB_Q$, and $\overline{BB_q}$ at a plurality of mixers at 1601.

At 1603, the harmonic rejection mixer receives, by each of the plurality of mixers, a plurality of clock signals, wherein one of the plurality of clock signals is in a reference phase, one of the plurality of LO clock signals is in a lagging phase by −45 degrees, and one of the plurality of clock signals is in a leading phase by +45 degrees, respectively.

At 1605, the harmonic rejection mixer sums the outputs of the plurality of mixers in a voltage-domain, based on capacitive summation, where a load on the output of the harmonic rejection mixer may be an input impedance of a device (e.g., a DA), and where the capacitive summation is weighted.

FIG. 17 is a flowchart of a method of manufacturing a harmonic rejection mixer, according to an embodiment of the present disclosure, where the harmonic rejection mixer is either implemented in hardware or implemented in hardware that is programed with software.

Referring to FIG. 17, the method, at 1701, forms the harmonic rejection mixer as part of a wafer or package that includes at least one other harmonic rejection mixer. The harmonic rejection mixer is configured to receive an input signal at a plurality of mixers; receive, by each of the plurality of mixers, a plurality of clock signals, wherein one of the plurality of clock signals is in a reference phase, one of the plurality of clock signals is in a lagging phase by −45 degrees relative to the reference phase, and one of the plurality of clock signals is in a leading phase by +45 degrees relative to the reference phase, respectively; and sum the outputs of the plurality of mixers, where the outputs are summed in a voltage-domain, based on capacitive summation, where a load on the output of the harmonic rejection mixer may be an input impedance of a device (e.g., a DA), and where the capacitive summation is weighted.

At 1703, the method tests the harmonic rejection mixer. Testing the harmonic rejection mixer includes testing the harmonic rejection mixer and the at least one other harmonic rejection mixer using one or more electrical to optical converters, one or more optical splitters that split an optical signal into two or more optical signals, and one or more optical to electrical converters.

FIG. 18 is a flowchart of constructing an integrated circuit, according to an embodiment of the present disclosure.

Referring to FIG. 18, the method, at 1801, generates a mask layout for a set of features for a layer of the integrated circuit. The mask layout includes standard cell library macros for one or more circuit features that include a harmonic rejection mixer. The harmonic rejection mixer is configured to receive an input signal at a plurality of mixers; receive, by each of the plurality of mixers, a plurality of clock signals, wherein one of the plurality of clock signals is in a reference phase, one of the plurality of clock signals is in a lagging phase by −45 degrees relative to the reference phase, and one of the plurality of clock signals is in a leading phase by +45 degrees relative to the reference phase, respectively; and sum the outputs of the plurality of mixers, where the outputs are summed in a voltage-domain, based on capacitive summation, where a load on the output of the harmonic rejection mixer may be an input impedance of a device (e.g., a DA), and where the capacitive summation is weighted.

At 1803, the method disregards relative positions of the macros for compliance to layout design rules during the generation of the mask layout.

At 1805, the method checks the relative positions of the macros for compliance to layout design rules after generating the mask layout.

At 1807, the method, upon detection of noncompliance with the layout design rules by any of the macros, modifies the mask layout by modifying each of the noncompliant macros to comply with the layout design rules.

The method of FIG. 18 may further include generating a mask according to the modified mask layout with the set of features for the layer of the integrated circuit and manufacturing the integrated circuit layer according to the mask.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined thereto.

What is claimed is:

1. An apparatus, comprising:
   a plurality of passive mixers, wherein each of the plurality of passive mixers includes a first input for receiving a baseband in-phase signal $BB_I$, a second input for receiving an inverse of the baseband in-phase signal $\overline{BB_I}$, a third input for receiving a baseband quadrature signal $BB_Q$, a fourth input for receiving an inverse of the baseband quadrature signal $\overline{BB_Q}$, a fifth input for receiving a first clock signal with a unique phase shift within one of the plurality of passive mixers, a sixth input for receiving a second clock signal with a unique phase shift within one of the plurality of passive mixers, a seventh input for receiving a third clock signal with a unique phase shift within one of the plurality of passive mixers, an eighth input for receiving a fourth clock signal with a unique phase shift within one of the plurality of passive mixers, and at least one output; and
   a voltage-domain vector summation array connected to the output of each of the plurality of passive mixers, wherein the voltage-domain vector summation array is comprised of capacitors
   and wherein the capacitors are comprised of:
      a first capacitor, including a first terminal connected to the at least one output of the first passive mixer, and a second terminal;
      a second capacitor, including a first terminal connected to the at least one output of the second passive mixer, and a second terminal connected to the second terminal of the first capacitor; and
      a third capacitor, including a first terminal connected to the at least one output of the third passive mixer, and a second terminal connected to the second terminal of the first capacitor,
   wherein the first capacitor has a weight of substantially C, the second capacitor has a weight of substantially 0.7 C, and
   the third capacitor has a weight of substantially 0.7 C.

2. The apparatus of claim 1, wherein the capacitors are weighted.

3. The apparatus of claim 1, wherein the plurality of passive mixers is comprised of:
   a first passive mixer configured to receive a clock signal at the second input with a reference phase shift;
   a second passive mixer configured to receive a clock signal at the second input with a leading phase shift relative to the reference phase shift; and
   a third passive mixer configured to receive a clock signal at the second input with a lagging phase shift relative to the reference phase shift.

4. The apparatus of claim 3, wherein the reference phase shift is a 0 degree phase shift, the leading phase shift is a +45 degree phase shift, and the lagging phase shift is a −45 degree phase shift.

5. The apparatus of claim 3, wherein each of the first passive mixer, the second passive mixer, and the third passive mixer is comprised of:
   a first n-channel metal oxide semiconductor field effect transistor (NMOSFET), including a source connected to the first input of a corresponding passive mixer, a gate connected to the fifth input of the corresponding passive mixer, and a drain connected to the at least one output of the corresponding passive mixer;
   a second NMOSFET, including a source connected to the second input of the corresponding passive mixer, a gate connected to the sixth input of the corresponding passive mixer, and a drain connected to the at least one output of the corresponding passive mixer;
   a third NMOSFET, including a source connected to the third input of the corresponding passive mixer, a gate connected to the seventh input of the corresponding passive mixer, and a drain connected to the at least one output of the corresponding passive mixer; and
   a fourth NMOSFET, including a source connected to the fourth input of the corresponding passive mixer, a gate connected to the eighth input of the corresponding passive mixer, and a drain connected to the at least one output of the corresponding passive mixer.

6. The apparatus of claim 3, wherein each of the first passive mixer, the second passive mixer, and the third passive mixer is comprised of:

a first n-channel metal oxide semiconductor field effect
transistor (NMOSFET), including a source connected
to the fourth input of a corresponding passive mixer, a
gate connected to the seventh input of the corresponding passive mixer, and a drain connected to a first
output of the at least one output of the corresponding
passive mixer;
a second NMOSFET, including a source connected to the
fourth input of the corresponding passive mixer, a gate
connected to the eighth input of the corresponding
passive mixer, and a drain connected to a second output
of the at least one output of the corresponding passive
mixer;
a third NMOSFET, including a source connected to the
third input of the corresponding passive mixer, a gate
connected to the eighth input of the corresponding
passive mixer, and a drain connected to the first output
of the at least one output of the corresponding passive
mixer;
a fourth NMOSFET, including a source connected to the
third input of the corresponding passive mixer, a gate
connected to the seventh input of the corresponding
passive mixer, and a drain connected to the second of
the at least one output of the corresponding passive
mixer;
a fifth NMOSFET, including a source connected to the
first input of the corresponding passive mixer, a gate
connected to the fifth input of the corresponding passive mixer, and a drain connected to the first output of
the at least one output of the corresponding passive
mixer;
a sixth NMOSFET, including a source connected to the
first input of the corresponding passive mixer, a gate
connected to the sixth input of the corresponding
passive mixer, and a drain connected to the second
output of the at least one output of the corresponding
passive mixer;
a seventh NMOSFET, including a source connected to the
second input of the corresponding passive mixer, a gate
connected to the sixth input of the corresponding
passive mixer, and a drain connected to the first output
of the at least one output of the corresponding passive
mixer; and
an eighth NMOSFET, including a source connected to the
second input of the corresponding passive mixer, a gate
connected to the fifth input of the corresponding passive mixer, and a drain connected to the second output
of the at least one output of the corresponding passive
mixer.

7. A method, comprising:
mixing, by a plurality of passive mixers, a baseband
in-phase signal $BB_I$, an inverse of the baseband in-phase signal $\overline{BB_I}$, a baseband quadrature signal $BB_Q$,
and an inverse of the baseband quadrature signal $\overline{BB_Q}$,
wherein each of the plurality of passive mixers includes
a first input for receiving $BB_I$, a second input for
receiving $\overline{BB_I}$, a third input for receiving $BB_Q$, a fourth
input for receiving $\overline{BB_Q}$, a fifth input for receiving a
first clock signal with a unique phase shift within one
of the plurality of passive mixers, a sixth input for
receiving a second clock signal with a unique phase
shift within one of the plurality of passive mixers, a
seventh input for receiving a third clock signal with a
unique phase shift within one of the plurality of passive
mixers, an eighth input for receiving a fourth clock
signal with a unique phase shift within one of the
plurality of passive mixers, and at least one output; and summing the mixed $BB_I$, $\overline{BB_I}$, $BB_Q$, and $\overline{BB_Q}$ by a
voltage-domain vector summation array connected to
the output of each of the plurality of passive mixers,
wherein the voltage-domain vector summation array is
comprised of capacitors; and
wherein the capacitors are comprised of:
a first capacitor, including a first terminal connected to
the at least one output of the first passive mixer, and
a second terminal;
a second capacitor, including a first terminal connected
to the at least one output of the second passive mixer,
and a second terminal connected to the second
terminal of the first capacitor; and
a third capacitor, including a first terminal connected to
the at least one output of the third passive mixer, and
a second terminal connected to the second terminal
of the first capacitor,
wherein the first capacitor has a weight of substantially C,
the second capacitor has a weight of substantially 0.7
C, and
the third capacitor has a weight of substantially 0.7 C.

8. The method of claim 7, wherein the capacitors are
weighted.

9. The method of claim 7, wherein the plurality of passive
mixers is comprised of:
a first passive mixer configured to receive a clock signal
at the second input with a reference phase shift;
a second passive mixer configured to receive a clock
signal at the second input with a leading phase shift
relative to the reference phase shift; and
a third passive mixer configured to receive a clock signal
at the second input with a lagging phase shift relative
to the reference phase shift.

10. The method of claim 9, wherein the reference phase
shift is a 0 degree phase shift, the leading phase shift is a +45
degree phase shift, and the lagging phase shift is a −45
degree phase shift.

11. The method of claim 9, wherein each of the first
passive mixer, the second passive mixer, and the third
passive mixer is comprised of:
a first n-channel metal oxide semiconductor field effect
transistor (NMOSFET), including a source connected
to the first input of a corresponding passive mixer, a
gate connected to the fifth input of the corresponding
passive mixer, and a drain connected to the at least one
output of the corresponding passive mixer;
a second NMOSFET, including a source connected to the
second input of the corresponding passive mixer, a gate
connected to the sixth input of the corresponding
passive mixer, and a drain connected to the at least one
output of the corresponding passive mixer;
a third NMOSFET, including a source connected to the
third input of the corresponding passive mixer, a gate
connected to the seventh input of the corresponding
passive mixer, and a drain connected to the at least one
output of the corresponding passive mixer; and
a fourth NMOSFET, including a source connected to the
fourth input of the corresponding passive mixer, a gate
connected to the eighth input of the corresponding
passive mixer, and a drain connected to the at least one
output of the corresponding passive mixer.

12. The method of claim 9, wherein each of the first
passive mixer, the second passive mixer, and the third
passive mixer is comprised of:
a first n-channel metal oxide semiconductor field effect
transistor (NMOSFET), including a source connected
to the fourth input of a corresponding passive mixer, a gate connected to the seventh input of the corresponding passive mixer, and a drain connected to a first output of the at least one output of the corresponding passive mixer;

a second NMOSFET, including a source connected to the fourth input of the corresponding passive mixer, a gate connected to the eighth input of the corresponding passive mixer, and a drain connected to a second output of the at least one output of the corresponding passive mixer;

a third NMOSFET, including a source connected to the third input of the corresponding passive mixer, a gate connected to the eighth input of the corresponding passive mixer, and a drain connected to the first output of the at least one output of the corresponding passive mixer;

a fourth NMOSFET, including a source connected to the third input of the corresponding passive mixer, a gate connected to the seventh input of the corresponding passive mixer, and a drain connected to the second of the at least one output of the corresponding passive mixer;

a fifth NMOSFET, including a source connected to the first input of the corresponding passive mixer, a gate connected to the fifth input of the corresponding passive mixer, and a drain connected to the first output of the at least one output of the corresponding passive mixer;

a sixth NMOSFET, including a source connected to the first input of the corresponding passive mixer, a gate connected to the sixth input of the corresponding passive mixer, and a drain connected to the second output of the at least one output of the corresponding passive mixer;

a seventh NMOSFET, including a source connected to the second input of the corresponding passive mixer, a gate connected to the sixth input of the corresponding passive mixer, and a drain connected to the first output of the at least one output of the corresponding passive mixer; and an eighth NMOSFET, including a source connected to the second input of the corresponding passive mixer, a gate connected to the fifth input of the corresponding passive mixer, and a drain connected to the second output of the at least one output of the corresponding passive mixer.

13. A method of manufacturing a harmonic rejection mixer, comprising:

forming the harmonic rejection mixer as part of a wafer or package that includes at least one other harmonic rejection mixer, wherein the harmonic rejection mixer is configured to mix, by a plurality of passive mixers, a baseband in-phase signal $BB_I$, an inverse of the baseband in-phase signal $\overline{BB_I}$, a baseband quadrature signal $BB_Q$, and an inverse of the baseband quadrature signal $\overline{BB_Q}$, wherein each of the plurality of passive mixers includes a first input for receiving $BB_I$, a second input for receiving $\overline{BB_I}$, a third input for receiving $BB_Q$, a fourth input for receiving $\overline{BB_Q}$, a fifth input for receiving a first clock signal with a unique phase shift within one of the plurality of passive mixers, a sixth input for receiving a second clock signal with a unique phase shift within one of the plurality of passive mixers, a seventh input for receiving a third clock signal with a unique phase shift within one of the plurality of passive mixers, an eighth input for receiving a fourth clock signal with a unique phase shift within one of the plurality of passive mixers, and at least one output; and sum the mixed $BB_I$, $\overline{BB_I}$, $BB_Q$, and $\overline{BB_Q}$ by a voltage-domain vector summation array connected to the output of each of the plurality of passive mixers, wherein the voltage-domain vector summation array is comprised of capacitors; and wherein the capacitors are comprised of:
a first capacitor, including a first terminal connected to the at least one output of the first passive mixer, and a second terminal;
a second capacitor, including a first terminal connected to the at least one output of the second passive mixer, and a second terminal connected to the second terminal of the first capacitor; and
a third capacitor, including a first terminal connected to the at least one output of the third passive mixer, and a second terminal connected to the second terminal of the first capacitor,
wherein the first capacitor has a weight of substantially C, the second capacitor has a weight of substantially 0.7 C, and
the third capacitor has a weight of substantially 0.7 C; and
testing the harmonic rejection mixer, wherein testing the harmonic rejection mixer comprises testing the harmonic rejection mixer and the at least one other harmonic rejection mixer using one or more electrical to optical converters, one or more optical splitters that split an optical signal into two or more optical signals, and one or more optical to electrical converters.

14. A method of constructing an integrated circuit, comprising:

generating a mask layout for a set of features for a layer of the integrated circuit, wherein the mask layout includes standard cell library macros for one or more circuit features that include a harmonic rejection mixer configured to mix, by a plurality of passive mixers, a baseband in-phase signal $BB_I$, an inverse of the baseband in-phase signal $\overline{BB_I}$, a baseband quadrature signal $BB_Q$, and an inverse of the baseband quadrature signal $\overline{BB_Q}$, wherein each of the plurality of passive mixers includes a first input for receiving $BB_I$, a second input for receiving $\overline{BB_I}$, a third input for receiving $BB_Q$, a fourth input for receiving $\overline{BB_Q}$, a fifth input for receiving a first clock signal with a unique phase shift within one of the plurality of passive mixers, a sixth input for receiving a second clock signal with a unique phase shift within one of the plurality of passive mixers, a seventh input for receiving a third clock signal with a unique phase shift within one of the plurality of passive mixers, an eighth input for receiving a fourth clock signal with a unique phase shift within one of the plurality of passive mixers, and at least one output; and sum the mixed $BB_I$, $\overline{BB_I}$, $BB_Q$, and $\overline{BB_Q}$ by a voltage-domain vector summation array connected to the output of each of the plurality of passive mixers, wherein the voltage-domain vector summation array is comprised of capacitors; and wherein the capacitors are comprised of:
a first capacitor, including a first terminal connected to the at least one output of the first passive mixer, and a second terminal;
a second capacitor, including a first terminal connected to the at least one output of the second passive mixer, and a second terminal connected to the second terminal of the first capacitor; and a third capacitor, including a first terminal connected to the at least one output of the third passive mixer, and a second terminal connected to the second terminal of the first capacitor, wherein the first capacitor has a weight of substantially C, the second capacitor has a weight of substantially 0.7 C, and the third capacitor has a weight of substantially 0.7 C;

disregarding relative positions of the macros for compliance to layout design rules during the generation of the mask layout;

checking the relative positions of the macros for compliance to layout design rules after generating the mask layout;

upon detection of noncompliance with the layout design rules by any of the macros, modifying the mask layout by modifying each of the noncompliant macros to comply with the layout design rules;

generating a mask according to the modified mask layout with the set of features for the layer of the integrated circuit; and manufacturing the integrated circuit layer according to the mask.

\* \* \* \* \*